United States Patent
Tung

(10) Patent No.: US 9,679,819 B1
(45) Date of Patent: Jun. 13, 2017

(54) SEMICONDUCTOR DEVICE AND METHOD FOR FABRICATING THE SAME

(71) Applicant: UNITED MICROELECTRONICS CORP., Hsin-Chu (TW)

(72) Inventor: Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/062,217

(22) Filed: Mar. 7, 2016

(30) Foreign Application Priority Data

Feb. 2, 2016 (CN) .......................... 2016 1 0072825

(51) Int. Cl.
| | |
|---|---|
| H01L 21/82 | (2006.01) |
| H01L 21/8238 | (2006.01) |
| H01L 29/06 | (2006.01) |
| H01L 27/092 | (2006.01) |
| H01L 21/02 | (2006.01) |

(52) U.S. Cl.
CPC .. H01L 21/823821 (2013.01); H01L 21/0243 (2013.01); H01L 21/02518 (2013.01); H01L 27/0924 (2013.01); H01L 29/0607 (2013.01)

(58) Field of Classification Search
CPC ............. H01L 29/7851; H01L 21/2255; H01L 29/0657; H01L 21/823821; H01L 21/0243; H01L 27/0924; H01L 21/02518; H01L 29/0607
See application file for complete search history.

(56) References Cited

U.S. PATENT DOCUMENTS

| | | |
|---|---|---|
| 5,770,490 A | 6/1998 | Frenette et al. |
| 7,074,656 B2 | 7/2006 | Yeo et al. |
| 8,114,761 B2 | 2/2012 | Mandrekar et al. |
| 8,697,515 B2 | 4/2014 | Yin et al. |
| 8,802,521 B1 | 8/2014 | Hung et al. |
| 2014/0367781 A1 | 12/2014 | Cheng et al. |
| 2015/0243739 A1* | 8/2015 | Chen .................. H01L 29/7851 257/623 |

FOREIGN PATENT DOCUMENTS

| | | |
|---|---|---|
| WO | 2009040707 | 4/2009 |
| WO | 2014204477 | 12/2014 |

\* cited by examiner

*Primary Examiner* — Roy Potter
*Assistant Examiner* — Paul Patton
(74) *Attorney, Agent, or Firm* — Winston Hsu

(57) ABSTRACT

A method for fabricating semiconductor device is disclosed. The method includes the steps of: providing a substrate having a first region and a second region; forming a first fin-shaped structure on the first region and a second fin-shaped structure on the second region; forming a first bump on the first region and a second bump on the second region; forming a first doped layer on the first fin-shaped structure and the first bump; and forming a second doped layer on the second fin-shaped structure and the second bump.

19 Claims, 6 Drawing Sheets

SEMICONDUCTOR DEVICE AND METHOD FOR FABRICATING THE SAME

BACKGROUND OF THE INVENTION

1. Field of the Invention

The invention relates to a semiconductor device and fabrication method thereof, and more particularly, to an approach of utilizing solid state doping (SSD) technique to form doped region on the bottom portion of fin-shaped structure.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, the design of fin-shaped structure in current FinFET fabrication still resides numerous bottlenecks which induces current leakage of the device and affects overall performance of the device. Hence, how to improve the current FinFET fabrication and structure has become an important task in this field.

SUMMARY OF THE INVENTION

According to a preferred embodiment of the present invention, a method for fabricating semiconductor device is disclosed. The method includes the steps of: providing a substrate having a first region and a second region; forming a first fin-shaped structure on the first region and a second fin-shaped structure on the second region; forming a first bump on the first region and a second bump on the second region; forming a first doped layer on the first fin-shaped structure and the first bump; and forming a second doped layer on the second fin-shaped structure and the second bump.

According to another aspect of the present invention, a semiconductor device is disclosed. The semiconductor device includes: a substrate having a first region and a second region; a first fin-shaped structure on the first region and a second fin-shaped structure on the second region; a bump between the first region and the second region; a first doped layer on the first fin-shaped structure and the bump; and a second doped layer on the second fin-shaped structure and the bump, in which the second doped layer contacts the first doped layer.

According to yet another aspect of the present invention, a semiconductor device is disclosed. The semiconductor device includes: a substrate having a first region and a second region; a first fin-shaped structure on the first region and a second fin-shaped structure on the second region; a first bump on the first region; a second bump on the second region; a first doped layer on the first fin-shaped structure and the first bump; and a second doped layer on the second fin-shaped structure and the second bump.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
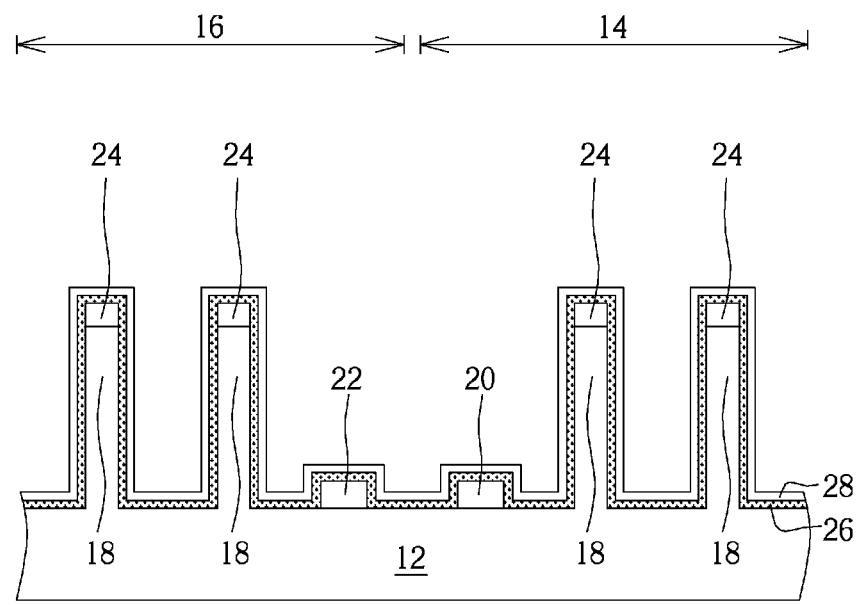
FIGS. 1-9 illustrate a method for fabricating a CMOS semiconductor device according to a preferred embodiment of the present invention.

Referring to FIGS. 1-9, FIGS. 1-9 illustrate a method for fabricating a CMOS semiconductor device according to a preferred embodiment of the present invention. As shown in FIG. 1, a substrate 12, such as a silicon substrate or silicon-on-insulator (SOI) substrate is provided, and a first region and a second region are defined on the substrate 12. In this embodiment, the first region is preferably a NMOS region 14 and the second region is a PMOS region 16, but not limited thereto. Next, at least a fin-shaped structure 18 and a bump 20 are formed on the NMOS region 14 and at least a fin-shaped structure 18 and a bump 22 are formed on the PMOS region 16, in which a hard mask 24 composed of silicon oxide or silicon nitride could be formed on each of the fin-shaped structures 18.

The formation of the fin-shaped structures 18 could be accomplished by first forming a patterned mask (now shown) on the substrate, 12, and then performing an etching process to transfer the pattern of the patterned mask to the substrate 12. Alternatively, the formation of the fin-shaped structure 18 could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structures 18. Moreover, if the substrate 12 were a SOI substrate, a patterned mask could be used to etch a semiconductor layer on the bottom oxide layer without etching through the semiconductor layer for forming the fin-shaped structure 18.

The formation of the bumps 20 and 22 could be accomplished by following the aforementioned approach to first forms a plurality of fin-shaped structures on the substrate 12, and then using a photo-etching process to lower the height of at least one of the fin-shaped structures for forming the bump 20 on NMOS region 14 and bump 22 on PMOS region 16. Preferably, the bumps 20, 22 and the fin-shaped structures 18 are composed of same material.

Next, a doped layer 26 and a liner 28 are formed to cover the fin-shaped structures 18 and bumps 20, 22 on NMOS region 14 and PMOS region 16, in which the doped layer 28 is preferably composed of silicon nitride and the doped layer 26 is a material layer containing p-type dopants, such as borosilicate glass (BSG).

Figure 2:
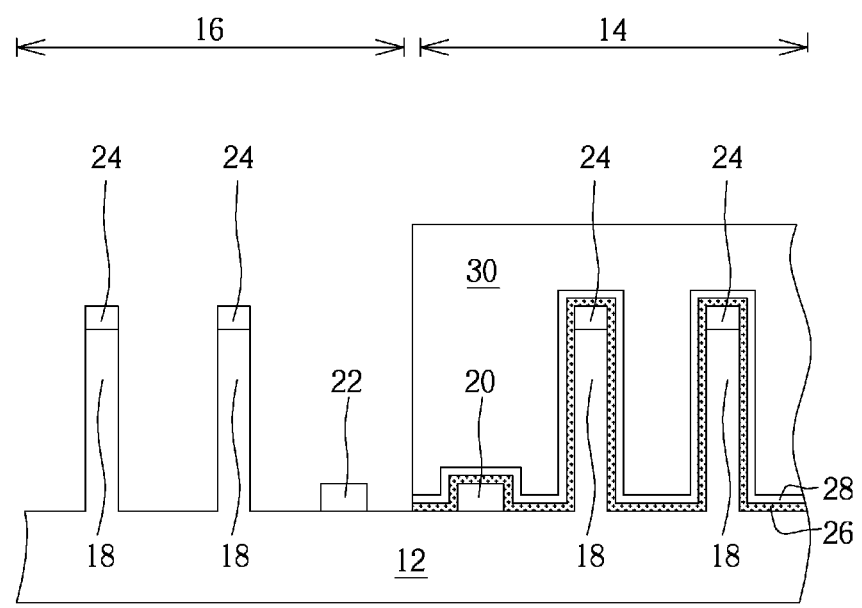

Next, as shown in FIG. 2, the liner 28 and the doped layer 26 are removed from the PMOS region 16. For instance, a patterned mask, such as a patterned resist 30 is formed on the liner 28 on NMOS region 14, and an etching process is conducted to remove the liner 28 and doped layer 26 on PMOS region 16 for exposing the fin-shaped structures 18 and bump 22 on PMOS region 16. The patterned resist 30 is then stripped thereafter.

Figure 3:
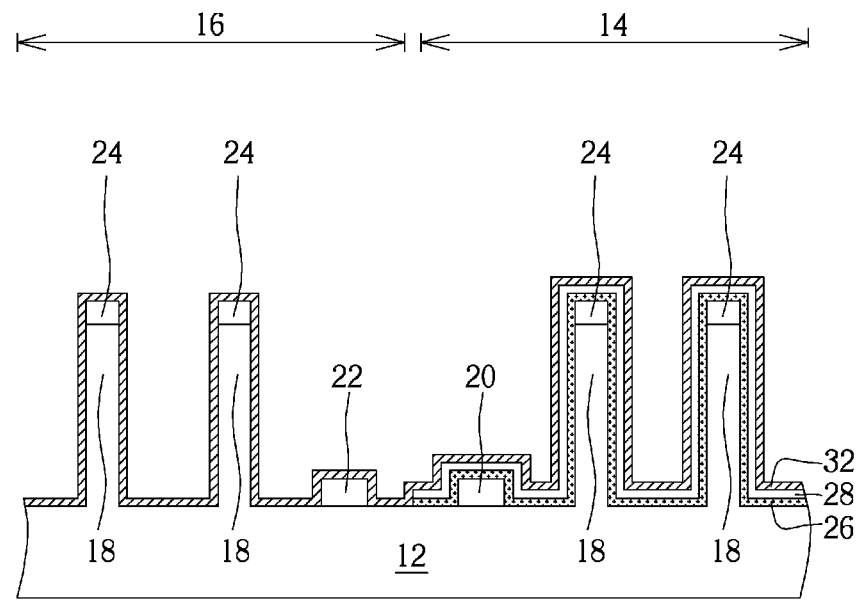

Next, as shown in FIG. 3, another doped layer 32 is formed on the fin-shaped structures 18 and bump 22 on PMOS region 16 and the doped layer 28 on NMOS region 14. Preferably, the doped layer 32 contains dopants having conductive type opposite from the doped layer 26. For instance, the doped layer 32 in this step is a material layer containing n-type dopants, such as phosphosilicate glass (PSG).

Figure 4:
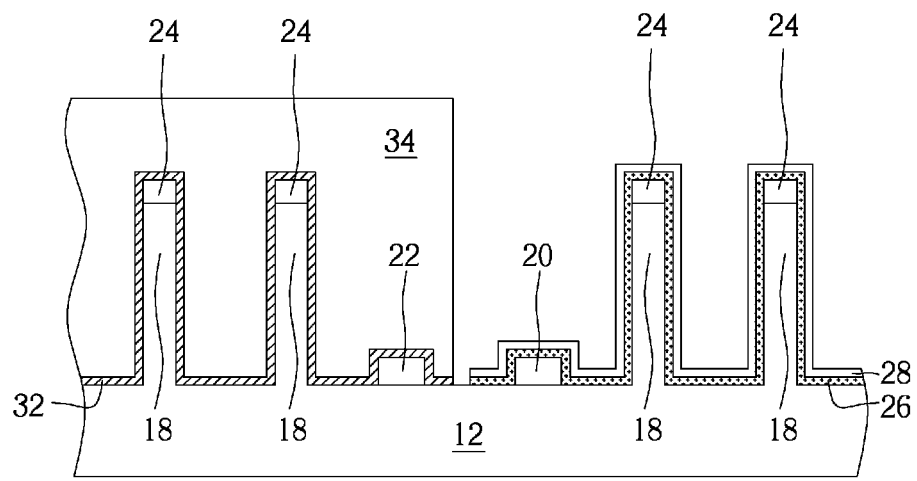

Next, as shown in FIG. 4, another patterned mask, such as a patterned resist 34 is formed on the doped layer 32 on the PMOS region 16, and an etching process is conducted to remove the doped layer 32 on NMOS region 14 to expose the liner 28 underneath. It should be noted that since part of the doped layer 32 is disposed between the NMOS region 14 and PMOS region 16, it would be desirable to expose part of the substrate 12 surface between the NMOS region 14 and PMOS region 16 while the doped layer 32 on the NMOS region 14 is removed. Nevertheless, it would also be desirable to adjust the position of the patterned resist 34 to align an edge of the patterned resist 34 to a contact surface between the doped layer 32 and the liner 28 so that none of the substrate 12 surface is exposed while the doped layer 32 on the NMOS region 14 is removed. The patterned resist 34 is then removed thereafter.

Figure 5:
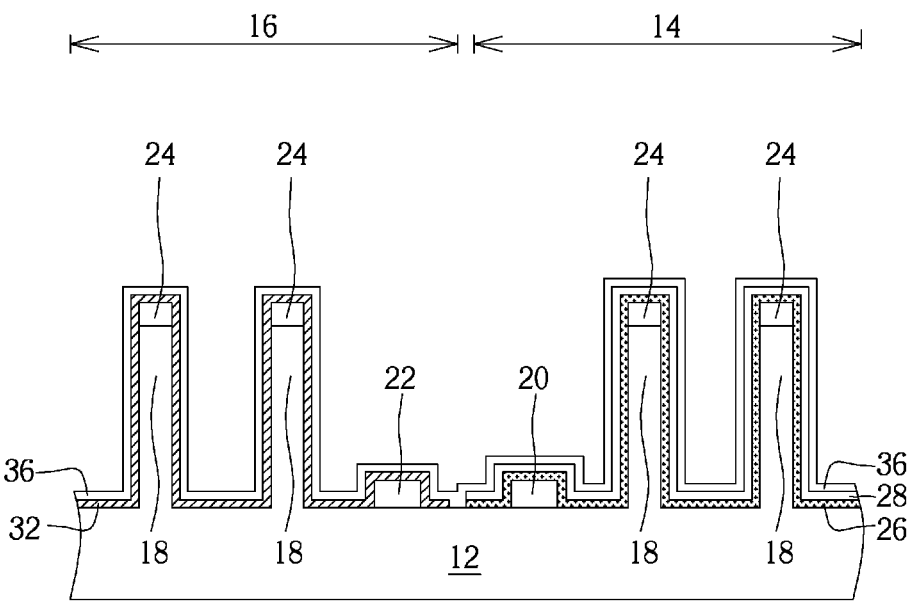

Next, as shown in FIG. 5, another liner 36 is formed on the doped layer 32 on PMOS region 16 and liner 28 on NMOS region 14 while filling the space between doped layer 32 and liner 28. In this embodiment, the material of the liner 36 could be the same as or different from the material of the liner 28. For instance, the liner 36 in this embodiment is preferably composed of silicon nitride, but not limited thereto.

Figure 6:
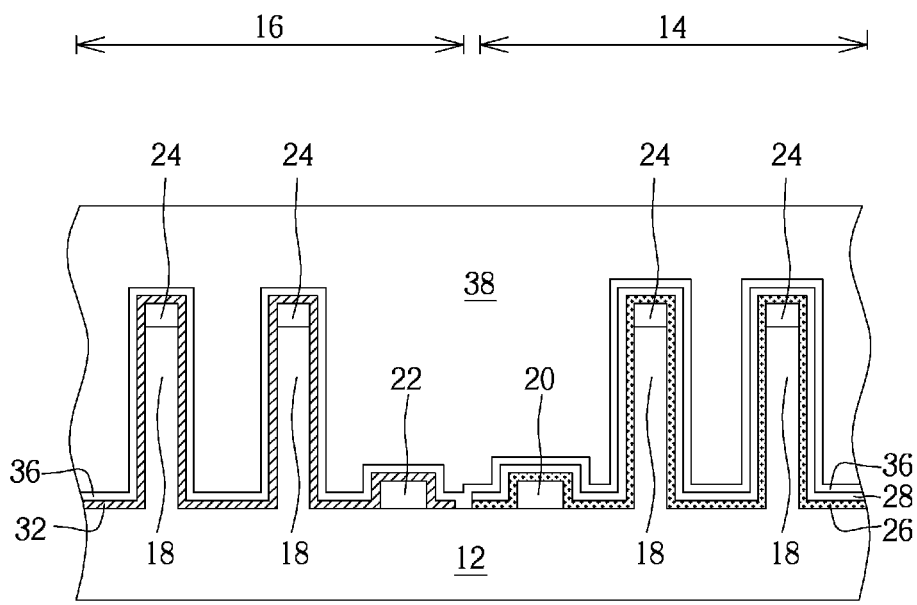

Next, as shown in FIG. 6, an insulating layer 38 is deposited on the liner 36 on NMOS region 14 and PMOS region 16 and higher than the top surface of each fin-shaped structure 18, in which the insulating layer 38 is preferably composed of silicon oxide, but not limited thereto.

Figure 7:
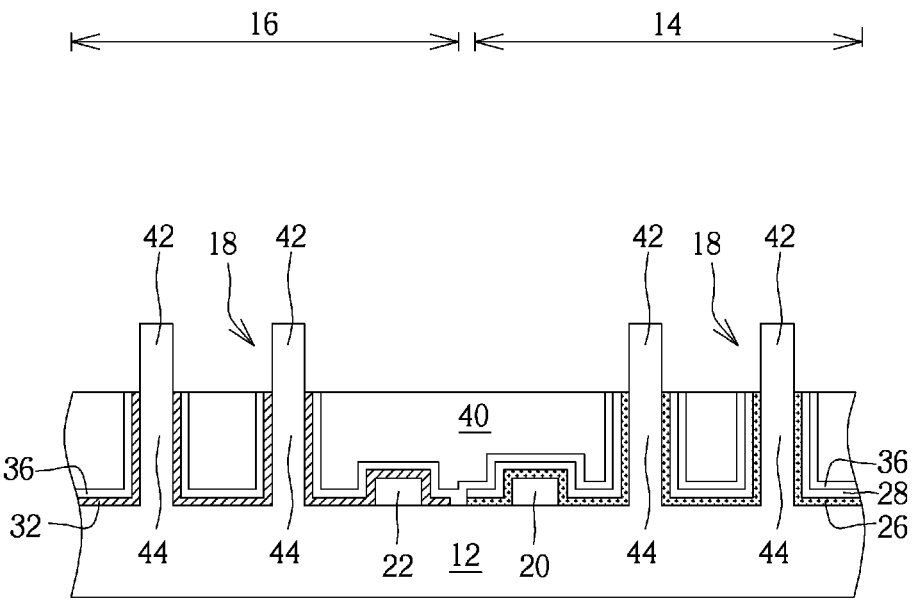

Next, as shown in FIG. 7, a planarizing process, such as chemical mechanical polishing (CMP) process is conducted to remove part of the insulating layer 38, part of the doped layers 26, 32, part of the liners 28, 36, the hard mask 24, and even part of the fin-shaped structures 18 so that the top surface of the remaining insulating layer 38 is even with the top surface of the fin-shaped structures 18. Next, an etching process is conducted to remove part of the insulating layer 38, part of the liner 36, part of the liner 28, and part of the doped layer 26 on NMOS region 14, and part of the liner 36 and part of the doped layer 32 on PMOS region 16 to form a shallow trench isolation (STI) 40. Preferably, the top surface of the STI 40 is slightly lower than the top surface of the fin-shaped structures 18 and the formation of the STI 40 also divides each of the fin-shaped structures 18 into a top portion 42 and a bottom portion 44, in which the top surface of the STI 40 is even with a bottom surface of the top portion 42 or a top surface of the bottom portion 44. More specifically, the top surface of the STI 40 is also even with the top surfaces of the remaining liner 36, the remaining doped layer 32, the remaining liner 28, and the remaining doped layer 26 and the STI 40 also surround the bottom portions 44 of the fin-shaped structures 18 on NMOS region 14 and PMOS region 16.

Next, an anneal process could be conducted selectively to drive the dopants within the doped layers 36 and 26 into the bottom portions 44 of the fin-shaped structures 18 and the bumps 20, 22 for forming doped regions, such as anti-punch-through (APT) regions for preventing leakage.

Figure 8:
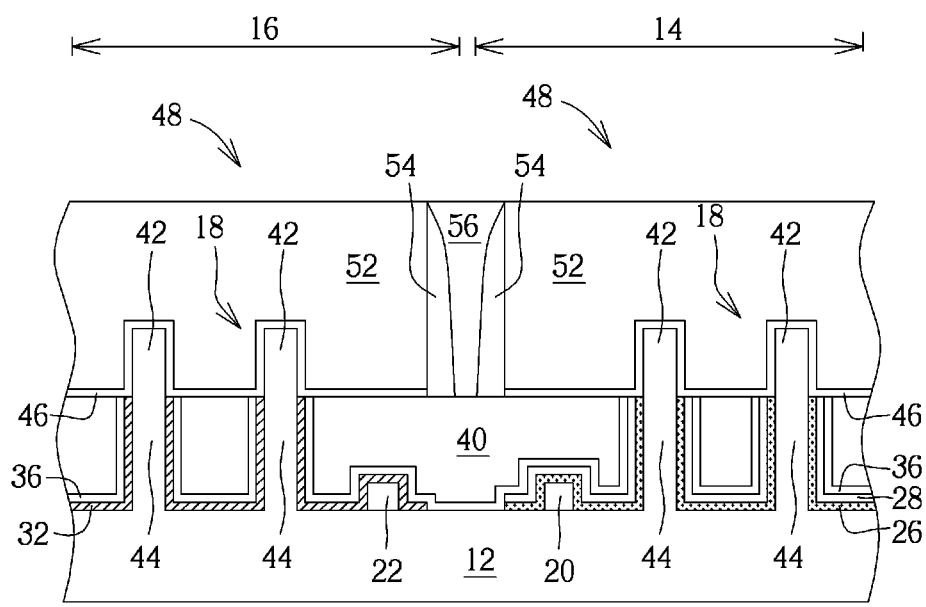

Next, as shown in FIG. 8, follow-up transistor fabrication processes could be carried out to form gate structures. For instance, an interfacial layer (not shown) and/or a gate dielectric layer 46 is formed on the NMOS region 14 and PMOS region 16, and a gate structure 48 is formed on the fin-shaped structures 18 on each of the NMOS region 14 and PMOS region 16. Each of the gate structures 48 is preferably composed of polysilicon material, in which the gate structure 48 on the NMOS region 14 covers or overlaps the fin-shaped structures 18 and bump 20 on the NMOS region 14 and the gate structure 48 on the PMOS region 16 covers or overlaps the fin-shaped structures 18 and bump 22 on the PMOS region 16.

In this embodiment, the formation of the gate structures 48 could be accomplished by a gate first process, a high-k first approach from a gate last process, or a high-k last approach from the gate last process. Since the present embodiment pertains to a high-k last approach, as shown in FIG. 8, it would be desirable to first form the gate structures 48 containing gate dielectric layer 46 and polysilicon material 52 on the fin-shaped structures 18, and then forming spacers 54 adjacent to the sidewalls of the gate structures 48. Preferably, the spacers 54 could be a single spacer or a composite spacer, which could be selected from the group consisting of silicon oxide, silicon nitride, silicon oxynitride, and silicon carbon nitride, but not limited thereto.

Next, source/drain regions could be formed in the fin-shaped structures 18 adjacent to two sides of each of the gate structure 48, and elements such as epitaxial layer, silicides, contact etch stop layer (CESL), and interlayer dielectric (ILD) layer 56 could be formed according to the demand of the product. Next, a replacement metal gate (RMG) process is conducted to transform the gate structures 48 composed of polysilicon into metal gates.

Figure 9:
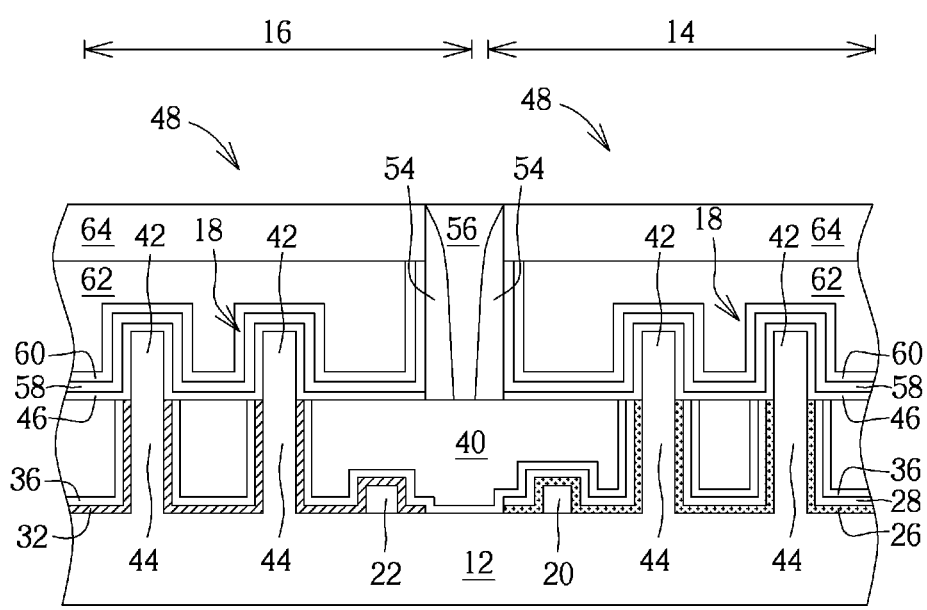

As shown in FIG. 9, each metal gate or gate structure 48 on NMOS region 14 and PMOS region 16 preferably includes a U-shaped high-k dielectric layer 58, a U-shaped work function metal layer 60, and a low resistance metal layer 62.

In this embodiment, the high-k dielectric layer 58 is preferably selected from dielectric materials having dielectric constant (k value) larger than 4. For instance, the high-k dielectric layer 58 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

The work function metal layer 60 is formed for tuning the work function of the later formed metal gates to be appropriate in an NMOS or a PMOS. For an NMOS transistor, the work function metal layer 60 having a work function ranging between 3.9 eV and 4.3 eV may include titanium aluminide (TiAl), zirconium aluminide (ZrAl), tungsten aluminide (WAl), tantalumaluminide (TaAl), hafniumaluminide (HfAl), or titanium aluminum carbide (TiAlC), but it is not limited thereto. For a PMOS transistor, the work function metal layer 60 having a work function ranging between 4.8 eV and 5.2 eV may include titanium nitride (TiN), tantalum nitride (TaN), tantalum carbide (TaC), but it is not limited thereto. An optional barrier layer (not shown)

could be formed between the work function metal layer 60 and the low resistance metal layer 62, in which the material of the barrier layer may include titanium (Ti), titanium nitride (TiN), tantalum (Ta) or tantalum nitride (TaN). Furthermore, the material of the low-resistance metal layer 62 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity.

Next, part of the high-k dielectric layer 58, part of the work function metal layer 60, and part of the low resistance metal layer 62 are removed to form recesses (not shown), and a hard mask 64 is formed in each recess so that the top surfaces of the hard mask 64 and ILD layer 56 are coplanar. The hard mask 64 could be selected from the group consisting of silicon oxide, silicon nitride, silicon oxynitride, and silicon carbon nitride. This completes the fabrication of a semiconductor device according to a preferred embodiment of the present invention.

Referring to FIG. 9, which further illustrates a structural view of a semiconductor device according to a preferred embodiment of the present invention. As shown in FIG. 9, the semiconductor device includes fin-shaped structures 18 on the NMOS region 14 and PMOS region 16, a bump 20 on the NMOS region 14, a bump 22 on the PMOS region 16, a doped layer 26 on the fin-shaped structures 18 and bump 20 of NMOS region 14, a doped layer 32 on the fin-shaped structures 18 and 22 of PMOS region 16, a liner 28 on the dope layer 26 and bump 20 on NMOS region 14, and a liner 36 on the doped layer 32 on PMOS region 16, the bump 22 on PMOS region 16, the bump 20 on NMOS region 14, and the liner 28 on NMOS region 14.

Specifically, each of the fin-shaped structures 18 on NMOS region 14 and PMOS region 16 includes a top portion 42 and a bottom portion 44, in which the doped layer 26, liner 28, and liner 36 on NMOS region 14 are disposed around the bottom portions 44 of the fin-shaped structures 18 and the doped layer 32 and liner 36 on PMOS region 16 are disposed around the bottom portions 44 of the fin-shaped structures 18.

In this embodiment, the bumps 20, 22 and fin-shaped structures 18 are composed of same material, and the height of the bumps 20, 22 is preferably between 2 to 20 times the thickness of the doped layer 26 or doped layer 32. The bottom portion 44 of each fin-shaped structure 18 and the bumps 20, 22 also include doped regions (not shown) such as anti-punch through layers used for preventing leakage, in which the bump 20 and bottom portions 44 of the fin-shaped structures 18 on NMOS region 14 preferably include doped regions having same conductive type and the bump 22 and bottom portions 44 of the fin-shaped structures 18 on PMOS region 16 preferably include doped regions having same conductive type.

The semiconductor device also includes a STI 40 around the bottom portions 44 on NMOS region 14 and PMOS region 16, in which the top surface of the STI 40 is not only aligned to the top surface of the bottom portions 44 of the fin-shaped structures 18 but also aligned to the top surfaces of the doped layer 26, liner 28, and liner 36 on NMOS region 14 and the doped layer 32 and liner 36 on PMOS region 16.

Figure 10:
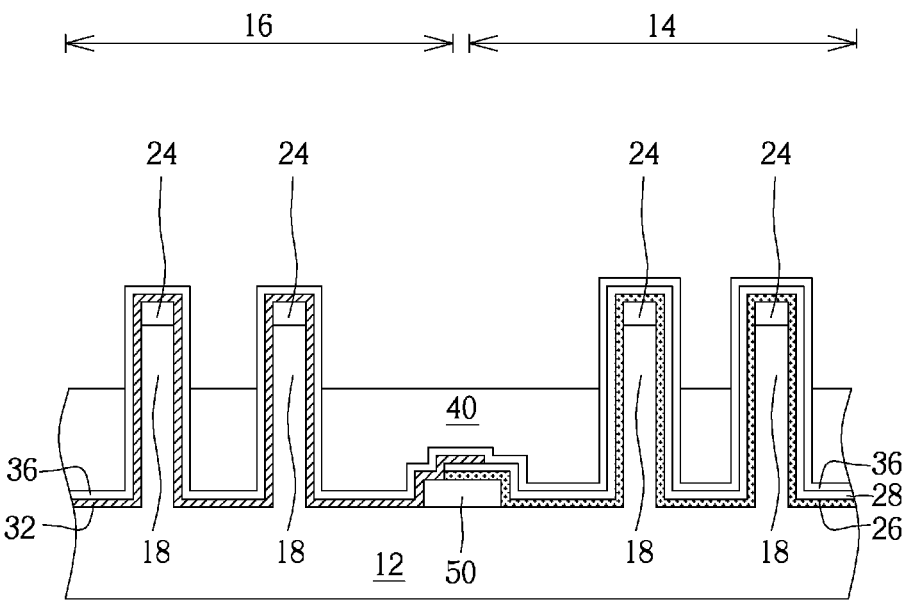
FIG. 10 illustrates a structural view of a semiconductor device according to an embodiment of the present invention.

Referring to FIG. 10, which illustrates a structural view of a semiconductor device according to another embodiment of the present invention. As shown in FIG. 10, the semiconductor device includes fin-shaped structures 18 on the NMOS region 14 and PMOS region 16, a bump 50 between the NMOS region 14 and PMOS region 16, a doped layer 26 on the bump 50 and the fin-shaped structures 18 on NMOS region 14, a doped layer 32 on the bump 50 and fin-shaped structures 18 on PMOS region 16, a liner 28 on the bump 50 and the doped layer 26 on NMOS region 14, and a liner 36 on the bump 50, the doped layer 32 on PMOS region 16, and the liner 28 on NMOS region 14.

In contrast to the embodiment shown in FIG. 9 having bumps 20, 22 on the NMOS region 14 and PMOS region 16 respectively, only one single bump 50 is disclosed in this embodiment in between the NMOS region 14 and PMOS region 16. Preferably, an edge of the doped layer 26 and an edge of the liner 28 are aligned on top of the bump 50, and the doped layer 32 also contacts both the doped layer 26 and the liner 28 on the bump 50. Similar to the embodiment from FIG. 9, the bump 50 and the fin-shaped structures 18 are composed of same material, and the height of the bump 50 is preferably between 2 times to 20 times the thickness of the doped layer 26 or doped layer 32.

It should be noted that after the structure in FIG. 10 is fabricated, an anneal process could be selective conducted to drive the dopants from doped layers 26, 32 into the bump 50 and bottom portions 44 of the fin-shaped structures 18 for forming doped regions, such as APT regions for preventing leakage. Since the doped layer 26 and doped layer 32 having two different type of conductive dopants are disposed on the single bump 50 at the same time, the bump 50 after the aforementioned anneal process would contain both n-type and p-type dopants.

Moreover, it would also be desirable to follow the aforementioned embodiment of forming an interfacial layer or gate dielectric layer on the NMOS region 14 and PMOS region 16 after the structure from FIG. 10 is fabricated, and then forming gate structures on the fin-shaped structures 18 on NMOS region 14 and PMOS region 16. Since only one single bump 50 is disclosed in this embodiment, it would be desirable to have the gate structure on NMOS region 14 covering the bump 50, or have the gate structure on PMOS region 16 covering the bump 50, or neither one of the gate structure on NMOS region 14 and PMOS region 16 covering the bump 50, which are all within the scope of the present invention.

Figure 11:
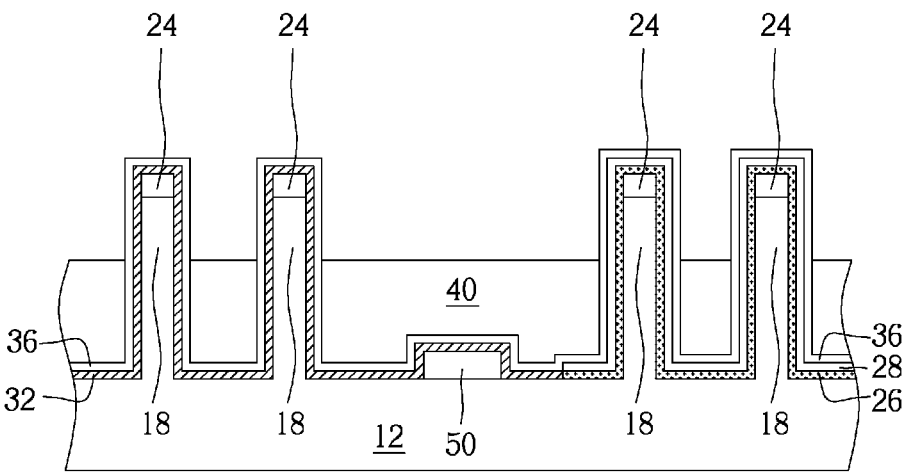
FIG. 11 illustrates a structural view of a semiconductor device according to an embodiment of the present invention.

Referring to FIG. 11, FIG. 11 illustrates a structural view of a semiconductor device according to another embodiment of the present invention. As shown in FIG. 11, the semiconductor device includes fin-shaped structures 18 on the NMOS region 14 and PMOS region 16, a bump 50 between the NMOS region 14 and PMOS region 16, a doped layer 26 on the bump 50 and the fin-shaped structures 18 on NMOS region 14, a doped layer 32 on the bump 50 and fin-shaped structures 18 on PMOS region 16, a liner 28 on the bump 50 and the doped layer 26 on NMOS region 14, and a liner 36 on the bump 50, the doped layer 32 on PMOS region 16, and the liner 28 on NMOS region 14.

In contrast to the embodiment shown in FIG. 10 of having the doped layer 32 contacting both the doped layer 26 and liner 28 at the same time on the bump 50, the doped layer 32 of this embodiment is disposed to cover the bump 50 entirely while the doped layer 32 contacts the doped layer 26 on the substrate 12 surface on NMOS region 14. Alternatively, instead of having the doped layer 32 from PMOS region 16 to cover the bump 50, it would also be desirable to have the doped layer 26 on NMOS region 14 to cover the bump 50 entirely and in this instance, the doped layer 26 would contact the doped layer 32 on the surface 12 surface on PMOS region 14.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a first region and a second region;
   forming a first fin-shaped structure on the first region and a second fin-shaped structure on the second region;
   forming a first bump on the first region and a second bump on the second region;
   forming a first doped layer on the first fin-shaped structure and the first bump;
   forming a second doped layer on the second fin-shaped structure and the second bump; and
   forming a first gate structure to cover the first bump.

2. The method of claim 1, further comprising:
   forming the first doped layer and a first liner on the first region and the second region;
   removing the first liner and the first doped layer from the second region;
   forming the second doped layer on the first region and the second region;
   removing the second doped layer from the first region;
   forming a second liner on the first region and the second region; and
   forming a shallow trench isolation (STI) around the first fin-shaped structure and the second fin-shaped structure.

3. The method of claim 2, wherein each of the first fin-shaped structure and the second fin-shaped structure comprises a top portion and a bottom portion, the method comprises:
   forming an insulating layer on the second liner; and
   removing part of the insulating layer, the first liner and the first doped layer around the top portion of the first fin-shaped structure, and the second liner and the second doped layer around the top portion of the second fin-shaped structure to form the STI around the bottom portion of the first fin-shaped structure and the bottom portion of the second fin-shaped structure.

4. The method of claim 1, further comprising:
   forming the first doped layer and a first liner on the first fin-shaped structure, the first bump, the second bump, and the second fin-shaped structure;
   removing the first liner and the first doped layer on the second bump and the second fin-shaped structure;
   forming the second doped layer on the second fin-shaped structure, the second bump, and the first liner;
   removing the second doped layer on the first liner;
   forming a second liner on the second doped layer and the first liner; and
   forming a shallow trench isolation (STI) around the first fin-shaped structure and the second fin-shaped structure.

5. The method of claim 4, wherein each of the first fin-shaped structure and the second fin-shaped structure comprises a top portion and a bottom portion, the method comprises:
   forming an insulating layer on the second liner; and
   removing part of the insulating layer, the first liner and the first doped layer around the top portion of the first fin-shaped structure, and the second liner and the second doped layer around the top portion of the second fin-shaped structure to form the STI around the bottom portion of the first fin-shaped structure and the bottom portion of the second fin-shaped structure.

6. A semiconductor device, comprising:
   a substrate having a first region and a second region;
   a first fin-shaped structure on the first region and a second fin-shaped structure on the second region;
   a bump between the first region and the second region;
   a first doped layer on the first fin-shaped structure and the bump;
   a second doped layer on the second fin-shaped structure and the bump, wherein the second doped layer contacts the first doped layer; and
   a gate structure covering the bump.

7. The semiconductor device of claim 6, further comprising:
   a first liner on the first doped layer and the bump;
   a second liner on the second doped layer, the bump, and the first liner.

8. The semiconductor device of claim 6, wherein each of the first fin-shaped structure and the second fin-shaped structure comprises a top portion and a bottom portion, and the first doped layer is around the bottom portion of the first fin-shaped structure and the second doped layer is around the bottom portion of the second fin-shaped structure.

9. The semiconductor device of claim 8, further comprising a shallow trench isolation (STI) around the first fin-shaped structure and the second fin-shaped structure, wherein the top surfaces of the STI and the bottom portions of the first fin-shaped structure and the second fin-shaped structure are coplanar.

10. The semiconductor device of claim 6, further comprising a shallow trench isolation (STI) covering the bump, the first doped layer, and the second doped layer.

11. The semiconductor device of claim 6, wherein the bump comprises n-type dopants and p-type dopants.

12. The semiconductor device of claim 6, wherein the second doped layer contacts the first doped layer on the substrate.

13. A semiconductor device, comprising:
    a substrate having a first region and a second region;
    a first fin-shaped structure on the first region and a second fin-shaped structure on the second region;
    a bump between the first region and the second region;
    a first doped layer on the first fin-shaped structure and the bump; and
    a second doped layer on the second fin-shaped structure and the bump, wherein the second doped layer contacts the first doped layer on the substrate.

14. The semiconductor device of claim 13, further comprising:
    a first liner on the first doped layer and the bump;
    a second liner on the second doped layer, the bump, and the first liner.

15. The semiconductor device of claim 13, wherein each of the first fin-shaped structure and the second fin-shaped structure comprises a top portion and a bottom portion, and the first doped layer is around the bottom portion of the first fin-shaped structure and the second doped layer is around the bottom portion of the second fin-shaped structure.

16. The semiconductor device of claim 15, further comprising a shallow trench isolation (STI) around the first fin-shaped structure and the second fin-shaped structure, wherein the top surfaces of the STI and the bottom portions of the first fin-shaped structure and the second fin-shaped structure are coplanar.

17. The semiconductor device of claim 13, further comprising a gate structure covering the bump.

18. The semiconductor device of claim 13, further comprising a shallow trench isolation (STI) covering the bump, the first doped layer, and the second doped layer.

19. The semiconductor device of claim 13, wherein the bump comprises n-type dopants and p-type dopants.

\* \* \* \* \*